United States Patent [19]

Damento et al.

[11] Patent Number: 4,824,826
[45] Date of Patent: Apr. 25, 1989

[54] MILLIMETER SIZE SINGLE CRYSTALS OF SUPERCONDUCTING YBA$_2$CU$_3$O$_x$

[75] Inventors: Michael A. Damento; Karl A. Gschneidner, Jr., both of Ames, Iowa

[73] Assignee: Iowa State University Research Foundation, Inc., Ames, Iowa

[21] Appl. No.: 95,317

[22] Filed: Sep. 10, 1987

[51] Int. Cl.$^4$ .................... C30B 9/06; C01F 17/00; C01G 3/02; H01L 39/12
[52] U.S. Cl. .................... 505/1; 156/624; 252/514; 252/521; 423/593; 423/604; 423/636; 501/152
[58] Field of Search .................... 252/518, 521, 514; 156/624; 423/593, 604, 636; 501/152; 505/1

[56] References Cited

U.S. PATENT DOCUMENTS

| | | | |
|---|---|---|---|
| 3,458,455 | 7/1969 | Jonker | 252/521 |
| 3,896,055 | 7/1975 | Bouchard et al. | 252/521 |
| 3,983,077 | 9/1976 | Fuller et al. | 252/520 |
| 4,049,789 | 9/1977 | Manabe et al. | 423/593 |
| 4,086,189 | 4/1978 | Honda et al. | 252/519 |

FOREIGN PATENT DOCUMENTS 2605585 8/1976 Fed. Rep. of Germany ........ 23/156

OTHER PUBLICATIONS

Kawabe, U. et al in *High Temperature Superconductors (Extended Abstracts)*, Symposium S, 1987, Spring Meeting of the M.R.S., Apr. 1987, pp. 251–252.
Aselage, T. et al in *High Temperature Superconductors (Extended Abstracts)*, Symposium S, 1987, Spring Meeting—M.R.S., Apr. 1987, pp. 157–159.
Inoue, T. et al., *Japanese Journal of Applied Physics*, vol. 26, No. 5, May 1987, pp. L732–L733.
Braginski, A. I., in *Novel Superconducting*, Proceeds of the Int'l Workshop on Novel Mech. of Superconductivity, Jun. 1987 (Penn.), pp. 935–949.
Hayashi, S., *Japanese Journal of Applied Physics*, vol. 26, No. 7, Jul. 1987, pp. L1197–L1198.
*High Tc Update*, vol. 1, No. 6, Jul. 15, 1987.
Damento, M. et al, "Preparation of Single Crystals of Superconducting YBa$_2$Cu$_3$O$_{7-x}$ from CuO Melts", Iowa State Univ. (Pre-Print).
Holland, G. et al. in *Chemistry of High-Temperature Superconductors*, American Chemical Society, Aug. 1987, pp. 102–113.
McKittrick, J. et al, *Advanced Ceramic Materials*, vol. 2, No. 3B (Special Supplementary Issue), pp. 353–363, Jul. 1987.
Kunkle, "Flux Growth of Stannic Oxide Crystals", *Journal of Applied Physics*, vol. 4, p. 1489 (1965).
*Chemical Abstracts*, 81:112623J (1974).

*Primary Examiner*—Paul Lieberman
*Assistant Examiner*—Linda Skaling
*Attorney, Agent, or Firm*—Zarley, McKee, Thomte, Voorhees & Sease

[57] ABSTRACT

A method of growing large, up to 1 mm size single crystals of superconducting YBa$_2$Cu$_3$O$_x$, wherein x equals from 6.5 to 7.2.

15 Claims, No Drawings

MILLIMETER SIZE SINGLE CRYSTALS OF SUPERCONDUCTING $YBa_2Cu_3O_x$

GRANT REFERENCE

This invention was made with Government support under Contract No. W-7405-ENG-82 awarded by the Department of Energy. The Government has certain rights in the invention.

BACKGROUND OF THE INVENTION

This invention relates to superconductive metal oxide ceramics, in particular to $YBa_2Cu_3O_x$, wherein x equals from 6.5 to 7.2

The technology of superconductivity, particularly metal oxide ceramics which conduct electricity with no resistance at temperatures above the boiling point of liquid nitrogen, unlike previously known materials that can superconduct only near absolute zero, has been rapidly developing. These materials, i.e. certain metal-oxide ceramics, can conduct electricity with no resistance at temperatures above the boiling point of liquid nitrogen (77 K or $-196°$ C). The discovery of these materials has been quite recent, and the demand for practical application of these materials will be ever increasing in the future. In particular, it is desirable to develop these new metal-oxide ceramics, particularly $YBa_2Cu_3O_x$, wherein x equals from 6.5 to 7.2 into useful conductor shapes such as wires, films, or thin sheets. It has not heretofore been possible to develop large, i.e. up to 1 mm in size, crystals of the material. It is desirable to do so for several reasons. Amongst those reasons include the ease of continued investigation of large crystals. The possibility that such large crystals can be easily developed into useful shapes such as superconducting rods, rings, wires, tapes and thin films.

Accordingly, this invention has as its primary objective the development of $YBa_2Cu_3O_x$ large single crystals.

Another objective of this invention is the development of such crystals by a process easy in practice and efficient in use from the standpoint of developing high yields of large, i.e. up to a millimeter or even larger size, crystals.

Perhaps one of the most promising of the new metal oxide ceramics found to be superconductors at relatively high temperatures is $YBa_2Cu_3O_x$. Recent testing has shown that this superconducting ceramic is a distorted oxygen deficient form of perovskite with a layered structure not seen in naturally occurring minerals.

In the typical process for development of this ceramic used to date, there is heating of an intimate mixture of the oxide or the carbonate powders of the solid elements at temperatures between 900° C. and 1100° C. in order to drive off carbon dioxide and other volatiles. After regrinding and reheating, the mixture is pressed into pellets and sintered (bonded without melting) at high temperatures for several hours. The pellets are then annealed at low temperatures, optimally 400° C. to 450° C.

The conditions under which the ceramic is prepared affect the oxygen content. This is important because structural studies have shown that the number and arrangement of oxygen atoms in the lattice is a key determinate of the oxide superconductive properties. In fact, to produce the highest superconductive transition temperatures, the ceramic should be heated in an atmosphere that has some oxygen present, some workers have even said pure oxygen. For further details of superconductivity of $YBa_2Cu_3O_x$ ceramic, see *Chemical Engineering and News,* May 11, 1978, pp. 7–16.

SUMMARY OF THE INVENTION

In accordance with the invention, large millimeter size crystals of $YBa_2Cu_3O_x$ are prepared in good yield with the proper oxygen content, i.e. x equals from 6.5 to 7.2.

This invention relates to a method of growing superconductive crystals of $YBa_2Cu_3O_x$, wherein x equals from 6.5 to 7.2. In accordance with the process, the oxide powders, copper and yttrium and the carbonate powder of barium are mixed with an excess of copper oxide being present over and above the stoichiometric amount necessary for the formation of $YBa_2Cu_3O_x$. This mixture is heated after mixing to form a melt flux, with the melt flux rapidly cooled to room temperature, followed by reheating the mixture to again form a melt flux, with the flux thereafter being held at a temperature below the melt point $YBa_2Cu_3O_x$ crystals, such that crystals form in the slurry of copper oxide melt flux, The crystals in the flux melt are thereafter gradually cooled to room temperature in order to produce the proper oxygen content. The crystals are removed by lightly crushing the solid block which results. The crystals are identified by their reflective surfaces and plate-like form.

DETAILED DESCRIPTION OF THE INVENTION

The discovery of high temperature superconductor $YBa_2Cu_3O_x$ has led to a large amount of research on this compound. In order to completely understand the relationship between the properties of the compound and the structure of the material, measurements on single crystals are necessary. Researchers have been trying to prepare large (up to 1 mm in size) single crystals of $YBa_2Cu_3O_x$ but have been thwarted by the decomposition of the compound at high temperatures. A method has now been discovered to prepare large single crystals of superconductive $YBa_2Cu_3O_x$.

The key to the present process is that the crystals must be formed in the presence of an excess of copper oxide above the stoichiometric amount necessary to form $YBa_2Cu_3O_x$ and the mixture of $Y_2O_3$, $BaCO_3$, and CuO must be melted to destroy the $YBa_2Cu_3O_x$ phase followed by slow cooling. With the practice of these two steps, it insures formation of large millimeter size crystals. As explained hereinafter, it is preferred that the crystals be grown in a platinum boat, vessel or container.

In accordance with the first step of the invention a mixture of the oxide carbonate powders of barium, copper oxide and yttrium oxide are employed. Preferably the mixture is barium carbonate, copper oxide and yttrium oxide. The mixture must contain an excess amount of the copper oxide over the stoichiometric amount needed for the formation of $YBa_2Cu_3O_x$, wherein x equals from 6.5 to 7.2. The amount of the excess copper oxide over the stoichiometric amount is from about 1.2 to about 3.0 times the stoichiometric amount, preferably from about 1.5 to about 2.0 times the stoichiometric amount. It is important, and one of the keys to the process of the present invention in forming the large crystals, that an excess of copper oxide be employed. While applicant does not wish to be bound by any theory, it is believed that the excess copper oxide acts as a molten flux or liquid phase out of which the crystals grow. The material is subdivided, preferably in a typical mill or mortar and pestle to provide a finely divided powder, of typical particle size of preferably 200 mesh, but more broadly from 100 mesh to 300 mesh. These are physically mixed together to provide a substantially uniform mixture.

The mixed powders are thereafter heated in a second step until they form a melt flux. This heating must be done in the presence of air. It may also work in pure oxygen. Preferably heating is at a temperature of from about 1150° C. to about 1200° C. It is desirable to not go above 1200° C. or else the vessel in which the heating occurs may in part melt and contaminate the flux. The most preferred vessel is a platinum boat. The time of heating can be from about 0.5 hrs up to about 2.0 hrs. The heating is finished when there is a substantially uniform melt flux.

In the next succeeding step of the process of this invention, the melt flux is rapidly cooled to room temperature. The cooling must be at a sufficiently rapid rate to prevent the melt (as it solidifies) from separating into phases. Generally it has been found most preferred to cool the melt to about 900° C. at about 100° per minute drop and thereafter cool it to room temperature within about 20 minutes to about 1.0 hrs. When this is done there is little or no undesired separation into phases as solidification occurs.

In accordance with the next step of the invention, the solidified material is now reheated for a time sufficient to again form a melt flux. The reheating step generally must be at a temperature above 900° C. but below 1200° C. The important fact is to reheat to a temperature which allows the copper oxide flux to melt and form a liquid phase in which the $YBa_2Cu_3O_x$ crystals can slowly grow. The most preferred temperature here is from 900° C. to 950° C. Heating to within this temperature range is thereafter followed by holding at the same temperature range for from about 1 day to about 7 days, preferably for from about 4 days to about 5 days. This allows the gradual formation of large millimeter size crystals of the desired $YBa_2Cu_3O_x$ in the flux. The flux and the crystals are then slowly cooled to room temperature, i.e. at a rate of 1° C. per minute. Crystals can be removed from the solid which results by lightly crushing. The crystals are identified by their reflective surfaces and plate-like form.

The single crystals which have been formed have been checked for superconductivity by the traditional test of demonstration of the Meissner effect. This effect is seen when a superconductor, which is immersed in an external magnetic field, excludes the flux lines.

The following examples serve to illustrate but not limit the process of this invention.

EXAMPLE 1

Single crystals were grown by first preparing a mixture of 42% $BaCO_3$, 46% CuO and 12% $Y_2O_3$ powders by weight and grinding with a mortar and pestle. This mixture contains an excess of CuO (186.6 grams excess CuO per mole of $YBa_2Cu_3O_x$) over that needed for $YBa_2Cu_3O_x$. This excess of CuO is the key to the process—it produces a low melting point phase which enhances crystal growth. Approximately 60 grams of the mixture was placed in a platinum boat and heated in an air atmosphere furnace at 1150° C. until the charge was melted (approximately 1 hour). The boat was then removed from the furnace and placed in a thick walled copper tube to rapidly cool the melt and avoid excessive segregation. The platinum boat containing the frozen material was returned to the furnace and held at 900° C. for four days followed by cooling at 1° C. per minute to room temperature. Crystals were removed by lightly crushing the solid block which resulted. The crystals were identified by their reflective surfaces and plate-like form. By making larger batches and increasing the holding time at 900° C. it should be possible to grow even larger crystals.

Crystals grown by the above method were in the form of plates, typically 1 mm in diameter and 0.2 mm thick with the c-axis of the orthohombic cell normal to the plate surface. The orientation of the crystals was determined by analyzing, with an x-ray diffractometer, a collection of crystals which were stuck to a glass slide. Most of the crystals were lying flat on the slide. An unusually large intensity from the (006) $YBa_2Cu_3O_{7-x}$ peak in the diffraction spectrum indicated that the plate face of each crystal did indeed correspond to the basal plane. Also, a back-reflection Laue pattern which was made with incident radiation perpendicular to the face of one crystal, showed near four-fold symmetry, although the true symmetry was two-fold. This is consistent with the orientation of the crystal and the orthohombic crystal structure since the a and b parameters of the crystal are nearly the same. The crystals contain a multitude of steps on the surfaces which correspond to the (001) or basal plane. It is believed that these are growth steps rather than cleavage steps. The (001) surfaces are highly reflective. Laue photography and initial metallography work indicate that the crystals are highly twinned.

Magnetic susceptibility measurements were made on one of these crystals with a Quantum Design SQUID magnetometer. The critical temperature of this crystal, determined as the temperature of the diamagnetic/paramagnetic transition on heating, was found to be 89K.

The growth mechanism of these crystals is not entirely understood but the melting of the starting material to destroy the $YBa_2Cu_3O_{7-x}$ phase and the liquid phase which is present at the holding temperature as a result of adding excess CuO are both essential aspects of the process. It appears that this low-melting liquid acts to transport material to the growing crystal rather than the crystals being formed by precipitation. It is likely that larger crystals could be grown by preparing larger batches and increasing the holding time and temperature.

What is claimed is:

1. A method of growing superconductive crystals of $YBa_2Cu_3O_x$ wherein x equals from 6.5 to 7.2, comprising
   (a) subdividing of mixture of oxides of copper and yttrium, and carbonate of barium, said mixture containing an excess of copper oxide over the stoichiometric amount needed for formation of $YBa_2Cu_3O_x$;
   (b) heating the subdivided mixture until it forms a melt flux wherein the oxides and carbonates are melted;
   (c) cooling the melt flux at a rapid rate sufficient to prevent the melt flux from separating into phases, to room temperature;
   (d) reheating the mixture for a time and temperature sufficient to again form a melt flux;

(e) holding the melt flux at temperatures above the melting point of said melt flux but below the melting point of crystals of $YBa_2Cu_3O_x$ to allow formation of millimeter size or larger crystals; and thereafter (f) slowly cooling the mixture to room temperature in an oxygen containing atmosphere at a rate to allow oxygen to enter said crystals sufficient to form said superconductive crystals of $YBa_2Cu_3O_x$.

2. The process of claim 1 wherein the crystals grown average about 1 mm in width.

3. The process of claim 1 wherein the amount of copper oxide is from about 1.2 to 3.0 times the stoichiometric amount.

4. The process of claim 3 wherein the amount of copper oxide is from about 1.2 to about 2.0 times the stoichiometric amount.

5. The process of claim 1 wherein the heating step (b) is to a temperature less than 1200° C.

6. The process of claim 5 wherein the heating step (b) is in a platinum crucible.

7. The process of claim 5 wherein the heating step (b) is at a temperature of from about 1150° C. to about 1200° C.

8. The process of claim 7 wherein the heating step (b) is for from about 0.5 to about 2.0 hours.

9. The process of claim 1 wherein in the rapid cooling of step (c) the melt is cooled to about 900° C. at about a 100° per minute, and then cooled to room temperature within from about 20 minutes to about 1.0 hours.

10. The process of claim 1 wherein reheating step (d) occurs to a temperature equaling at least the melting point of copper oxide flux.

11. The process of claim 1 wherein reheating is to a temperature within the range of from 900° C. to 950° C.

12. The process of claim 1 wherein the time for holding the melt flux to allow crystal formation is from about one day to about seven days.

13. The process of claim 1 wherein the slow cooling is for from about 1.0 hours to about 24.0 hours.

14. The process of claim 13 wherein the cooling was at about 1° C. per minute.

15. A method of growing superconductive crystals of $YBa_2Cu_3O_x$ wherein x equals from 6.5 to 7.2, comprising:

(a) subdividing of mixture of oxides of copper and yttrium, and carbonate of barium, said mixture containing an excess of copper oxide over the stoichiometric amount need for formation of $YBa_2Cu_3O_x$;

(b) heating the subdivided mixture to no more than 1200° C. for two hours or less until it forms a melt flux wherein the oxides and carbonates are melted;

(c) cooling the melt flux, at a rapid rate sufficient to prevent the melt from separating into phases to room temperature;

(d) reheating the mixture for a time and temperature sufficient to again form a melt flux;

(e) holding the melt flux at temperatures above the melting point of said melt flux but below the melting point of crystals of $YBa_2Cu_3O_x$ to allow formation of millimeter size or larger crystals; and thereafter (f) slowly cooling the mixture to room temperature in an oxygen containing atmosphere at a rate to allow oxygen to enter said crystals sufficient to form said superconductive crystals of $YBa_2Cu_3O_x$.

* * * * *